United States Patent
Robert et al.

(10) Patent No.: US 8,785,330 B2
(45) Date of Patent: Jul. 22, 2014

(54) METHOD FOR PRODUCING A STRUCTURE COMPRISING AT LEAST ONE ACTIVE PART HAVING ZONES OF DIFFERENT THICKNESSES

(71) Applicant: Commissariat a l'energie atomique et aux energies alternatives, Paris (FR)

(72) Inventors: Philippe Robert, Grenoble (FR); Sophie Giroud, Grenoble (FR)

(73) Assignee: Commissariat a l'energie atomique et aux energies alternatives, Paris (FR)

( * ) Notice: Subject to any disclaimer, the term of this patent is extended or adjusted under 35 U.S.C. 154(b) by 0 days.

(21) Appl. No.: 13/682,847

(22) Filed: Nov. 21, 2012

(65) Prior Publication Data
US 2013/0267049 A1  Oct. 10, 2013

(30) Foreign Application Priority Data

Nov. 30, 2011 (FR) ...................................... 11 60973

(51) Int. Cl.
*H01L 21/302* (2006.01)
*H01L 21/461* (2006.01)

(52) U.S. Cl.
USPC ........... 438/712; 438/311; 438/706; 438/745; 257/E21.006; 257/E21.092; 257/E21.115; 257/E21.121; 257/E21.218; 257/E21.227; 257/E21.267; 257/E21.278; 257/E21.293; 257/E21.304; 257/E21.32; 257/E21.632

(58) Field of Classification Search
USPC ......... 438/712, 706, 745, 740, 752, 753, 692, 438/311, 199, 8, 786, 787, 733; 257/E21.006, E21.092, E21.115, 257/E21.121, E21.218, E21.227, E21.23, 257/E21.267, E21.278, E21.293, E21.304, 257/E21.32, E21.632
See application file for complete search history.

(56) References Cited

U.S. PATENT DOCUMENTS

| 4,426,070 | A | 1/1984 | Garceau et al. |
| 5,287,082 | A | 2/1994 | Arney et al. |
| 6,461,888 | B1 | 10/2002 | Sridhar et al. |
| 7,494,839 | B2 * | 2/2009 | Benzel et al. ................... 438/53 |
| 7,972,888 | B1 | 7/2011 | Li et al. |
| 2008/0261345 | A1 | 10/2008 | Villa et al. |
| 2013/0000411 | A1 | 1/2013 | Robert et al. |

FOREIGN PATENT DOCUMENTS

WO   WO 2010/092399 A2   8/2010

OTHER PUBLICATIONS

U.S. Appl. No. 13/688,746, filed Nov. 29, 2012, Robert.

(Continued)

*Primary Examiner* — David Nhu
(74) *Attorney, Agent, or Firm* — Oblon, Spivak, McClelland, Maier & Neustadt, L.L.P.

(57) ABSTRACT

A method for producing a structure including an active part with a first and a second suspended zone. The method includes machining the front face of a first substrate to define the lateral contours of at least one first suspended zone according to a first thickness less than that of the first substrate forming a stop layer of etching of the first suspended zone under the suspended zone, forming on the front face of the first substrate a sacrificial layer, machining from the rear face of the first substrate up to releasing the sacrificial layer to form at least one second suspended zone to reach the stop layer of the first suspended zone, and releasing the first and second suspended zones.

25 Claims, 12 Drawing Sheets

(56) References Cited

OTHER PUBLICATIONS

French Preliminary Search Report issued Aug. 23, 2012 in Patent Application No. 1160973 with English Translation of Category of Cited Documents.

Ph. Robert et al., "M&NEMS: A new Approach for Ultra-low Cost 3D Inertial Sensor", Sensors, XP-031618603, Oct. 25, 2009, pp. 963-966.

E. Ollier et al., "Lateral MOSFET Transistor with Movable Gate for NEMS Devices Compatible with "In-IC" Integration", Proceedings on the 3$^{rd}$ IEEE International Conference on Nano/Micro Engineered and Molecular Systems, Jan. 6-9, 2008, pp. 764-769.

Benedetto Vigna, "Physical Sensors Drive MEMS Consumerization Wave (Part 1)", STMicroelectronics—Microelectromechanical-systems, Oct. 18, 2007, 4 pages.

Gary K. Fedder, "MEMS Fabrication", Test Conference Proceedings, vol. 1, 2003, pp. 691-698.

Wenhua Zhang et al., "SCREAM'03: A Single Mask Process for High-Q Single Crystal Silicon MEMS", 2004 ASME International Mechanical Engineering Congress and Exposition, Nov. 13-20, 2004, 5 pages.

Kevin A. Shaw et al., "Integrating SCREAM Micromachined Devices with Integrated Circuits", Micro Electro Mechanical Systems, 1996, pp. 44-48.

S. Armbruster et al., "A Novel Micromachining Process for the Fabrication of Monocrystalline Si-membranes Using Porous Silicon", Digest of Technical Papers Transducers '03, 2003, pp. 246-249.

\* cited by examiner

METHOD FOR PRODUCING A STRUCTURE COMPRISING AT LEAST ONE ACTIVE PART HAVING ZONES OF DIFFERENT THICKNESSES

CROSS-REFERENCE TO RELATED APPLICATION

This application claims the benefit of priority under 35 U.S.C. §119 from French Application No. 11-60973 filed Nov. 30, 2011.

TECHNICAL FIELD AND PRIOR ART

The present invention relates to a method for producing a structure comprising at least one active part having zones of different thicknesses. Said structure may be implemented in the production of MEMS (microelectromechanical systems) and/or NEMS (nanoelectromechanical systems) to produce for example sensors or actuators.

MEMS and NEMS sensors comprise a fixed part and at least one part suspended with respect to the fixed part, the suspended part(s) known as "active parts" are capable of moving and/or deforming under the effect of an external action, such as a mechanical, electrical, magnetic action, etc.

The movement and/or the deformation of the moveable part with respect to the fixed part make it possible to determine for example an acceleration in the case of an accelerometer, a Coriolis force in the case of a gyrometer. The movement of the moveable part is for example measured by means of a strain gauge.

The article Ph. Robert, V. Nguyen, S. Hentz, L. Duraffourg, G. Jourdan, J. Arcamone, S. Harrisson, M&NEMS: A new approach for ultra-low cost 3D inertial sensor, IEEE SENSORS 2009 Conference—25-28 Oct. 2009—Christchurch New Zealand, (2009) describes a MEMS&NEMS structure forming an accelerometer in the plane. The structure comprises an active part formed of two separate active thicknesses: the NEMS part forming a strain gauge comprises one of the active thicknesses, and the MEMS part forming a seismic mass comprises the two active thicknesses.

The method for producing such an active part takes place from an SOI (Silicon on Insulator) type substrate, which has a high production cost. In addition, a step of thick epitaxial growth is implemented, such a step is generally long and costly. The strain gauge is formed from the SOI substrate, the seismic mass is formed from the SOI substrate and the layer formed by thick epitaxy.

Furthermore, the step of defining the active part implements an oxide layer on which the growth of semi-conductor will in part take place. However, the layer formed by growth on the oxide layer is not monocrystalline in the interface zones between the two thicknesses, which was protected by the oxide layer.

Said "poly-crystalline" zones can generate defects in the structure.

In addition, the rate of growth is different between the zones where growth takes place on the monocrystalline silicon and the zones where growth takes place on the oxide layer for example, which forms the interface of the two thicknesses. This difference in rate of growth may lead to considerable inhomogeneities of thickness in the final structure.

This problem of inhomogeneity of structure due to the presence of polycrystalline zones in the monocrystalline layers and inhomogeneity of thickness is all the more problematic in the case where it is wished to have available more than two separate layers or interface zones between two layers of large surface.

Methods for producing MEMS and/or NEMS not using a SOI substrate exist.

For example, the document U.S. Pat. No. 7,494,839 uses a silicon substrate rendered porous in localised zones, the membrane of the MEMS being formed by epitaxy on the porous zones.

Said method has the drawback that the structure obtained does not have electrical insulation of the active part of the MEMS. Moreover, it also requires a thick epitaxy.

Another method designated SCREAM for "Single Crystal Reactive Etch and Metallization" uses a standard substrate to produce a MEMS component and uses a buried part of the substrate as sacrificial layer. After etching of the MEMS structure in the substrate, steps of thermal oxidation and etching of the oxide layer take place. The substrate is then etched to release the MEMS and finally a metallisation of the structure is carried out. Said method has a reduced production cost, however it has several drawbacks.

The structure has no insulating anchoring.

This thus assumes having oxidised MEMS structures to insulate them electrically and metallised on the surface. This causes the creation of significant mechanical strains on the MEMS due to the presence of the thermal oxide and the metal on the released structures. Said strains may be very penalising for the final component, for example they can generate temperature drifts. Moreover, this addition of oxide and metal on the monocrystalline silicon renders the mechanical component less good, for example in the case of a resonator the quality factor is less good. In addition, the metallisation which takes place after releasing the structure requires the use of a mechanical masking during the deposition. Said method is difficult to apply industrially, in addition it gives a very mediocre resolution of the patterns.

This method does not make it possible to obtain two active monocrystalline layers of different thicknesses and superimposed.

Finally, since the MEMS structures are etched under the oxide mask during the isotropic etching of the silicon, these are poorly defined.

Finally a method designated "SON" for "Silicon On Nothing" exists, consisting in growing a layer of SiGe on a standard silicon substrate, and on said layer of SiGe growing a layer of monocrystalline silicon. This method is for example described in the document "*Lateral MOSFET transistor with movable gate for NEMS devices compatible with "In-IC" integration*", E. Ollier1, & Al./IEEE-NEMS 2008 Conference. The MEMS/NEMS component is formed on this latter layer of silicon and the SiGe serves as sacrificial layer. For the releasing of the mechanical structure, a CF4 based dry etching of the SiGe is used, selective with respect to the monocrystalline silicon.

Said method has a reduced production cost, however it also has several drawbacks. The isotropic etching of the SiGe is not very selective with respect to the silicon. Said method is thus limited to the releasing of narrow patterns, typically less than one μm.

The thickness of silicon epitaxied on the SiGe is generally limited to several hundred nanometers. In fact, dislocations would risk appearing if it was wished to obtain high thicknesses of silicon.

Since SiGe is semi-conductor, to have electrically insulated zones on the MEMS/NEMS, an insulating layer has to be provided in the zones that have to be electrically insulated. The layer of epitaxied silicon above said insulating layer will then be polycrystalline and not monocrystalline. This may be particularly detrimental for the mechanical strength of the structure, since said zones correspond to anchoring zones where the material is particularly subject to stress. Moreover, the fact of having a polycrystalline material in said anchoring zones, rather than monocrystalline, leads either to having a less good quality factor, in the case of a resonating structure, or to being more fragile to mechanical strains.

DESCRIPTION OF THE INVENTION

It is consequently an aim of the present invention to offer a method for producing a structure comprising an active part comprising at least two zones of different thicknesses, at least one of said zones being made of monocrystalline semi-conductor material, said method being of reduced cost and not having the aforementioned drawbacks.

The aim of the present invention is attained by a method for producing a structure provided with an active part with several thicknesses, comprising, from a first substrate formed at least on the front face of a layer of monocrystalline semi-conductor material, a step of machining of contours of a first suspended zone of a first thickness in said layer on the front face, a step of forming an etching stop layer between the first suspended zone and the rear face of the first substrate, a step of depositing a sacrificial material and a step of machining from the rear face of the first substrate to form a second suspended zone of a second thickness and a step of releasing the first and second suspended zones by removal of said sacrificial material.

Thanks to the invention, an SOI substrate is not used to, the production cost of such a structure is thus reduced compared to a method using a SOI substrate.

Moreover, since the method does not require thick epitaxy, savings in production cost and in time ensue. Moreover, since the inhomogeneities of thickness are reduced, it is not necessary to have a step of important chemical mechanical polishing to make up for the thickness differences.

It is possible to functionalise the sacrificial layer to form for example electrodes, a ground plane connected to the MEMS layer or anti-bonding stops.

Thanks to the invention, it is also possible to carry out a CMOS integration in three dimensions.

The subject matter of the present invention is consequently a method for producing a structure comprising an active part comprising at least one first suspended zone and a second suspended zone of different thicknesses from a first substrate comprising a first face made of monocrystalline semi-conductor material, called front face, and a second face opposite to the first face, called rear face, said method comprising the following steps:

a) machining the front face of the first substrate to define the lateral contours of at least one first suspended zone made of monocrystalline semi-conductor material according to a first thickness less than that of the first substrate, and passivating said lateral contours;

b) forming a stop layer of etching of the first suspended zone between said first suspended zone and the rear face;

c) forming on the front face of the first substrate a sacrificial layer selective to the etching with respect to the semi-conductor material of the first substrate;

d) machining from the rear face of the first substrate up to releasing certain zones of said sacrificial layer to form at least one second suspended zone and to make it possible to reach the stop layer of the first suspended zone;

e) releasing the first and second suspended zones.

The first substrate may be solid (or bulk) in this case it is entirely made of monocrystalline semi-conductor material. In a variant, it may be multilayer, at least the layer of which one face corresponds to the front face of the substrate is then made of monocrystalline semi-conductor material.

Step d) of machining to make it possible to form the second suspended zone and for machining to reach the stop layer may be obtained by simultaneous machining or by successive machinings.

The passivation of the lateral contours is carried out for example by the deposition of a passivation layer on said contours or thermal oxidation of said contours.

In a very advantageous manner, the rear face of the first substrate being monocrystalline semi-conductor material, the second suspended zone is made of monocrystalline semi-conductor material.

In a first embodiment, between step a) and step b), a step of isotropic etching takes place to remove a portion of semi-conductor material situated between the first suspended zone and the rear face, so as to release a cavity intended to receive the stop layer. The semi-conductor material may be polycrystalline, it is preferably monocrystalline.

In a second embodiment, during step b), the stop layer is formed by thermal oxidation to transform a portion of semi-conductor material situated between the first suspended zone and the rear face, and to form said stop layer.

The stop layer may be formed by thermal oxidation, and/or by deposition of oxide.

For example, the stop layer has a thickness comprised between 0.1 µm and 2 µm.

The formation of the sacrificial layer may be carried out by deposition of oxide.

In one embodiment example, step b) and step c) are merged.

Step d) may be carried out by etching, of the deep reactive-ion etching type.

The releasing of step e) may be carried out for example with hydrofluoric acid.

The first substrate may comprise a stacking of a layer of monocrystalline SiGe covered with a layer of monocrystalline silicon, the front face being made of monocrystalline silicon and step a) being such that the first suspended zone comprises a layer of monocrystalline silicon and a layer of monocrystalline SiGe.

Advantageously, prior to step b), at least the SiGe layer of the suspended zone is removed.

It may be provided that the method comprises, between step c) and before step d), a step c') of bonding or depositing a second substrate on the front face of the first substrate. The method may then comprise, prior to step c'), a step of structuring the second substrate.

During the structuring step, a front face of the second substrate is etched so as to form patterns for the second suspended zone and a deposition is carried out on said structured face of a layer intended to form a bonding layer during the step of bonding of the second substrate. Said patterns are for example intended to form mechanical stops.

The bonding of the first and second substrates is obtained for example by direct bonding or eutectic bonding.

The method may comprise, following step c), the step of structuring the sacrificial layer and/or depositing one or more intermediate layers on said sacrificial layer, said intermediate layers being able to be structured.

For example, the structuring of the sacrificial layer and the intermediate layer(s) is carried out by lithography and etching respectively of the sacrificial layer with stoppage on the substrate and the intermediate layer(s) with stoppage on the sacrificial layer.

A step of depositing an oxide layer may be provided on the structured sacrificial layer and/or the intermediate layer(s) and a step of planarisation of the oxide layer, said oxide layer participating in the bonding.

It could also be provided that the first substrate is structured before step a).

Steps a) to b) may be repeated in order to form an active part having more than two layers.

The semi-conductor material of the front face of the first substrate is advantageously made of monocrystalline silicon.

The method according to the invention enables for example the production of microelectromechanical structures and/or nanoelectromechanical structures to produce sensors and/or actuators.

The sensor may be a pressure sensor comprising at least one deformable membrane suspended on a substrate, one of the faces of the membrane being intended to be subjected to the pressure to be measured, means of detection of the deformation of the membrane formed by at least one strain gauge, said gauge(s) being formed by the first suspended zone(s), said means of detection being formed from the substrate and means of transmission of the deformation of the membrane to the means of detection, said means of transmission comprising a longitudinal arm articulated in rotation on the substrate around an axis substantially parallel to the plane of the membrane and being integral at least partially with the membrane such that it transmits to the means of detection, in an amplified manner, the deformation or the strain from the deformation of the membrane, said longitudinal arm being formed by the second suspended zone, said means of transmission being formed from the substrate.

BRIEF DESCRIPTION OF DRAWINGS

The present invention will be better understood by means of the description that follows and by referring to the appended drawings in which.

DETAILED DESCRIPTION OF PARTICULAR EMBODIMENTS

Figure 1A:
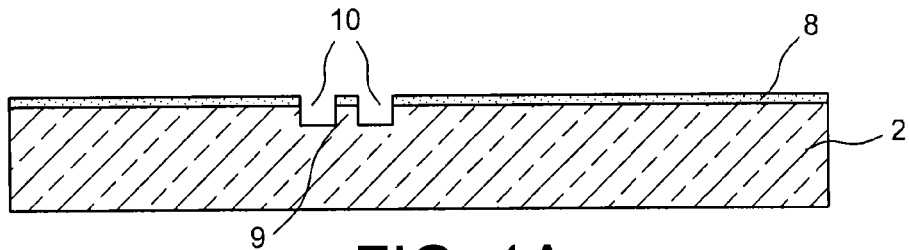
FIGS. 1A to 1J are schematic representations of different steps of an example of method for producing a multi-thickness active part according to a first embodiment.

In the present application, "active part" of a MEMS and/or NEMS structure designates a suspended part, capable of moving and/or deforming under the effect of an external action (mechanical, electrical, magnetic, etc.). The zone that will be designated "first suspended zone" may form a NEMS part of a MEMS&NEMS structure, and the zone that will be designated "second suspended zone" may form a MEMS part of a MEMS&NEMS structure.

In the description that follows and for reasons of simplicity, the example of silicon will be used as semi-conductor material. It should be noted that the implementation of any other semi-conductor material does not go beyond the scope of the present invention.

In the methods described, only a first suspended zone and a second suspended zone are formed for reasons of simplicity, however the methods according to the invention make it possible to form one or more first suspended zones and one or more second suspended zones.

In FIGS. 1A to 1J may be seen the steps of an example of a first embodiment of a production method according to the present invention of a structure comprising an active part provided with zones of different thicknesses.

The method according to the first embodiment comprises the following main steps from a first bulk type silicon substrate:

a1) machining the front face of the first substrate to define a first suspended zone according to a first thickness;

b1) forming a stop layer of etching of the first suspended zone between said suspended zone and the rear face, to do this a prior step of removing the semi-conductor material arranged under the first suspended zone takes place so as to form a cavity around and under the first suspended zone;

c1) depositing a sacrificial layer selective to the etching with respect to silicon, and more generally with respect to the semi-conductor material of the first substrate;

d1) machining from the rear face of the first substrate up to releasing certain zones of said sacrificial layer to form at least one second suspended zone and/or to make it possible to reach the stop layer of the first suspended zone;

e1) releasing the first and second suspended zones.

In an advantageous manner, between step c1) and step d1), the step c1') is provided for transfer or deposition of a support on the front face of the first substrate.

Steps a1) to e1) of the method will now be described in detail.

In the example represented in FIGS. 1A to 1J, the method uses a first substrate 2 made of monocrystalline silicon. The first substrate 2 comprises a front face 4 and a rear face 6.

During the first step a1), a deposition of an oxide layer 8, for example $SiO_2$, is carried out on the front face 4 of the substrate 2, of around 0.6 µm thickness.

A step of lithography is then carried out on the layer 6 by deposition of a resin layer, to delimit a first suspended zone, intended for example to form the first suspended zone 9. For example, it is wished to produce a gauge (of suspended beam type) of width comprised for example between 0.2 µm and 1 µm wide, of thickness comprised for example between 0.2 µm and 1 µm and length comprised between 5 µm and 100 µm.

Then, the layer 8 is etched with stoppage on the silicon of the front face 4.

In the example represented, two cavities 10 are formed on either side of the first suspended zone 9.

The front face 4 is then etched over a depth comprised between 0.4 µm and 1 µm, which corresponds to the desired thickness of the gauge with an over-etching of typically 0.1 µm to several µm depth for example. It involves for example an etching with stoppage over time.

The layer 8 is etched for example by chemical etching or by reactive-ion etching (RIE) and the front face 2 is etched by RIE or DRIE (deep reactive-ion etching).

Finally, the resin layer is removed.

The element thereby obtained is represented in FIG. 1A.

During the second step b1), it is sought to eliminate the silicon situated under the gauge in the representation of FIG. 1A.

To do this, a deposition of a conforming passivation layer 12 of thickness of the order of 0.3 µm for example is carried out, in order to protect the lateral edges or sides of the first suspended zone.

The material of said layer is selected so as to be selective with respect to the isotropic etching of the silicon, which will be described hereafter. It may be for example $SiO_2$, nitride or a deposition of ALD type ($Al_2O_3$, $HfO_2$) ("Atomic Layer Deposition"), the thickness of which is of the order of several nanometers. The passivation layer 12 covers the bottom and the edges of the cavities 10 as well as the layer 8.

Figure 1B:
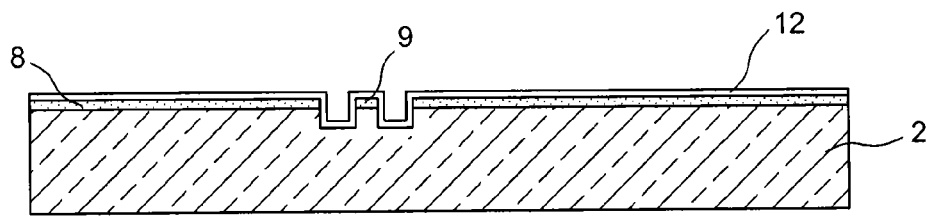

The element thereby obtained is represented in FIG. 1B.

Then an etching of the passivation layer 12 is carried out to uncover the silicon in the bottom of the cavities 10. Preferably, the etching takes place over 0.5 µm depth in order to be sure to release the bottom of the cavities. The etching is for example an etching over time with stoppage on the oxide layer 8.

Figure 1C:
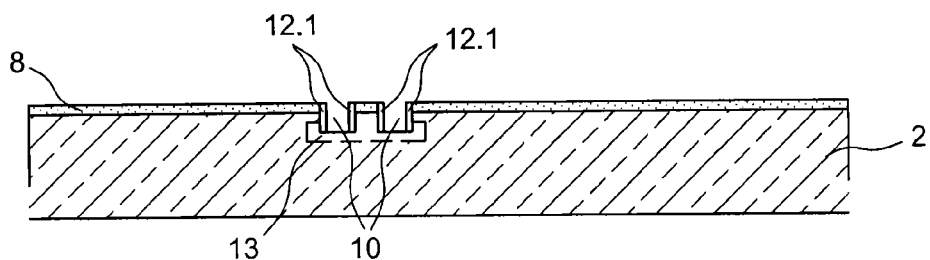

The element thereby obtained is represented in FIG. 1C. Only portions 12.1 of the passivation layer 12 remain on the sides of the cavities.

Then, according to the first embodiment, an isotropic etching is carried out to release the first suspended zone. It involves an etching over time. For example, it involves an RIE or a chemical etching.

The portion of silicon 13 situated under the first suspended zone is then etched. On account of the presence of the portions 12.1 of the passivation layer, the sides of the first suspended zone have been protected. It should be noted that the sides have nevertheless been able to be attacked partially from below the suspended zone.

Figure 1D:
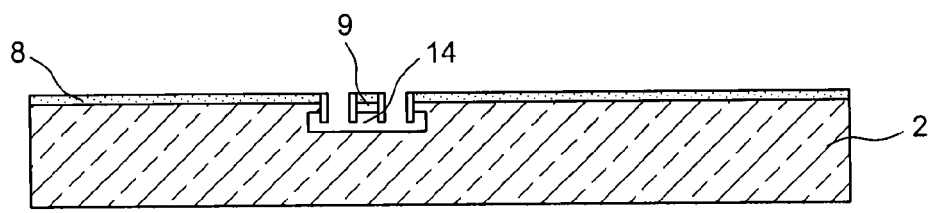

The element thereby obtained is represented in FIG. 1D. A cavity 14 is then formed under and around the first suspended zone.

During step c1), a deposition of a layer is carried out intended to protect the first suspended zone from the etching of the silicon during step d1). Said layer, designated stop layer 15, is formed at least in the bottom of the cavity 14.

Prior to this deposition, preferably the removal of the oxide layer 8 and passivation portions 12.1 is carried out. The removal of the oxide layer 8 is obtained by wet etching or RIE.

The stop layer 15 has a sufficient thickness to protect the first suspended zone 9 from the etching of step d1), this is for example comprised between 0.1 µm and 1 µm.

The formation of the stop layer 15 may be obtained by a step of thermal oxidation. An oxidation of limited thickness is provided so as not to consume too much material of the gauge. Typically an oxidation is carried out over a thickness from 50 nm to 200 nm. This consumption of silicon may be taken into account during the etching of the gauge in the selection of the initial dimensions (width, depth) of the gauge. Said oxidation has the advantage of eliminating the roughness on the lateral sides of the first suspended zone 9 and ensuring a protection all around the gauge.

Alternatively, the stop layer 15 may be obtained by the deposition of $SiO_2$.

The deposition of $SiO_2$ may entirely or partially fill the cavity 14.

In a particularly advantageous variant, prior to the deposition of the oxide layer, a thermal oxidation is carried out, which ensures that the lower face of the first suspended zone is effectively covered with a stop layer.

Then or simultaneously, the deposition of the sacrificial layer 16 on the front face of the substrate is carried out. The material of the layer 16 is selective with respect to the silicon for the step of etching of the MEMS and the step of releasing. The sacrificial layer 16 may be formed during the filling of the cavity 14, or during a following step.

It is sought to control the thickness of the sacrificial layer. For example, this will be of the order of 1 µm.

If the cavity 14 is only partially filled, hollows will appear in line with the cavity 14 on the front face. There is then an imperfect contact during the bonding with the second substrate, however since said zone has to be releasd subsequently, this is not bothersome for the operation of the device.

Figure 1E:
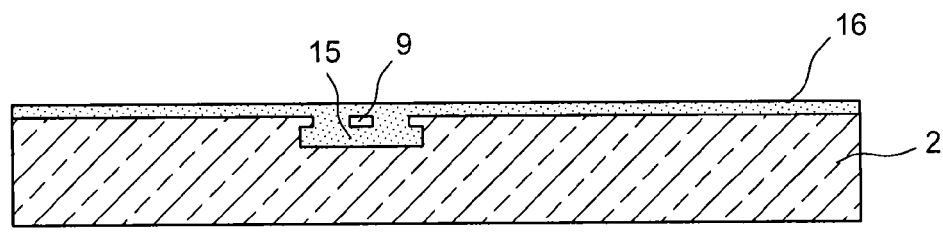

The element thereby obtained is represented in FIG. 1E.

A step of planarisation of the oxide layer 16 may take place in the case where the topology or the roughness of the surface obtained after deposition of the layer 14 is too important. Said planarisation is for example carried out by chemical mechanical polishing.

Said planarization step may be implemented when it is sought to completely fill the cavity 14, the sacrificial layer thereby formed may then have too great thickness, a thinning of the sacrificial layer is then carried out.

Alternatively, it could be envisaged to keep the oxide layer 8 to form the sacrificial layer and uniquely form a stop layer 15 at least in the bottom of the cavity 14.

During step c1'), a second substrate 18 is bonded on the layer 16. The second substrate 18 may be of bulk type for example made of monocrystalline silicon, glass, etc., or CMOS or pre-processed. The sacrificial layer 16 is then arranged between the first substrate 2 and the second substrate 18.

Figure 1F:
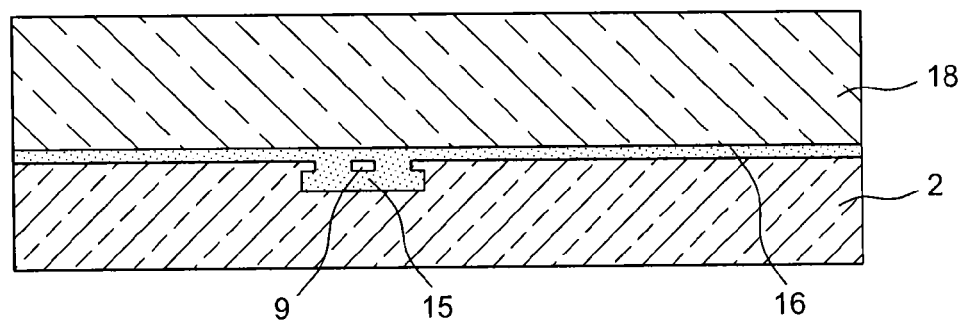

The assembly is formed, in the example represented in FIG. 1F, by direct bonding (or SDB for Silicon Direct Bonding) which is a technique well known to those skilled in the art. The bonding could also be carried out by eutectic bonding, or polymer bonding, etc., the second substrate forms a support, it could for example be envisaged that it is made of Pyrex®. In this case, the interface layer 16 is for example composed of a $SiO_2$/SiN type multilayer to enable the releasing of the MEMS without etching the Pyrex® support substrate. The element thereby obtained is represented in FIG. 1F.

The assembly thereby formed is then turned over and thinning of the first substrate 2 from its rear face 6 may optionally be carried out. Thinning to a thickness from several microns to several hundreds of microns, for example 25 µm, is carried out. The thinning is for example carried out by abrasion on the rear face or "back-grinding", then chemical mechanical polishing.

This thinning makes it possible to define the thickness of the MEMS part in the case of structures known as MEMS&NEMS.

Figure 1G:
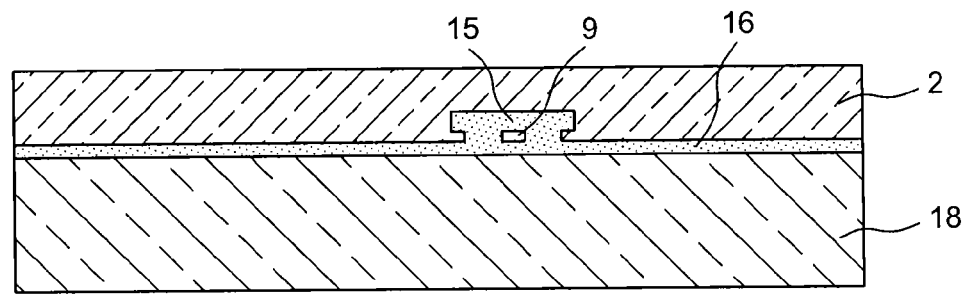

The element thereby obtained is represented in FIG. 1G.

During a following step, a deposition of a metal layer is carried out in order to form electrical contacts 20, on the rear face of the first substrate 2, which forms the front face of the element obtained by the bonding of the first and second substrates. To do this, a step of lithography then a step of etching are carried out.

Figure 1H:
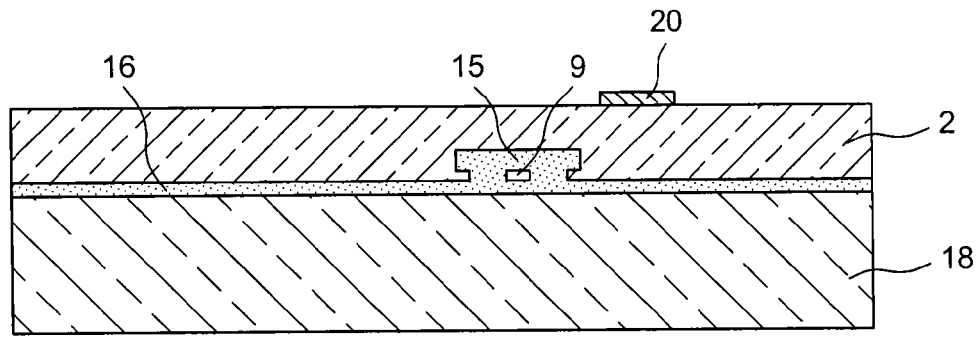

The element thereby obtained is represented in FIG. 1H.

During step d), a lithography and a DRIE take place for example, of the first substrate 2 so as to release certain zones of the sacrificial layer 16 to form the second suspended zone 19, and to reach the stop layer 15 between the bottom of the cavity 14 and the first suspended zone 9. The thickness of the stop layer 15 is such that it protects the first suspended zone from the deep etching.

Figure 1I:
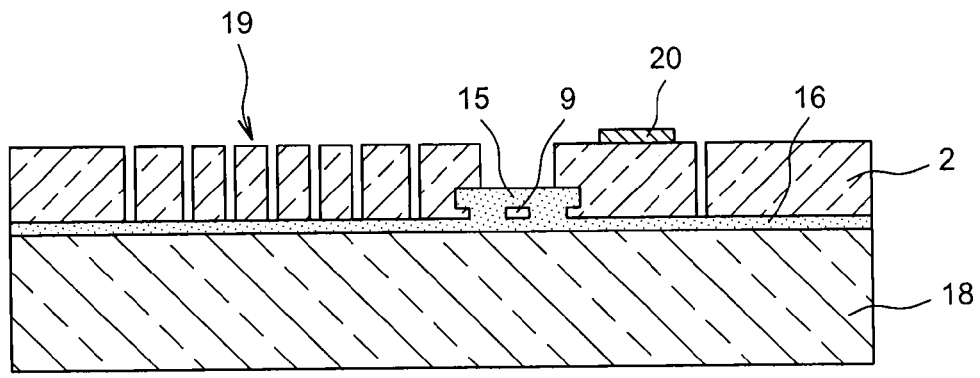

The element thereby obtained is represented in FIG. 1I.

Finally, during a step e1), the first and second suspended zones are released for example by wet or vapour phase etching of the sacrificial layer 16 between the two substrates and the stop layer 15, with hydrofluoric acid. It involves an etching over time.

Figure 1J:
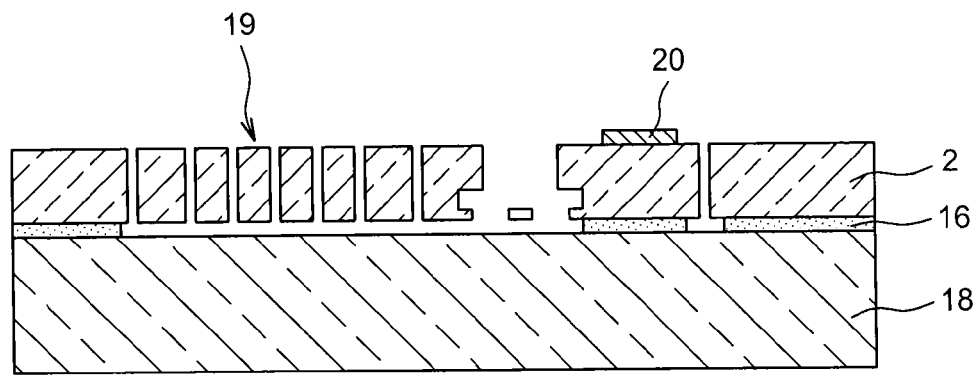

The element thereby obtained is represented in FIG. 1J.

In FIGS. 2A to 2D may be seen another example of embodying a method according to the first embodiment, wherein the first substrate 102 is formed of several layers.

During a step prior to step a1), a layer of monocrystalline SiGe 102.2 is formed on a substrate made of monocrystalline silicon 102.1, for example by epitaxial growth, for example of a thickness of 30 nm.

Then, a layer of monocrystalline silicon 102.3 is formed on the layer of SiGe 102.2, for example by epitaxial growth, for example of a thickness comprised between 10 nm and several micrometers, for example 250 nm. The free face of the layer 102.3 forms the front face of the first substrate 102.

Figure 2A:
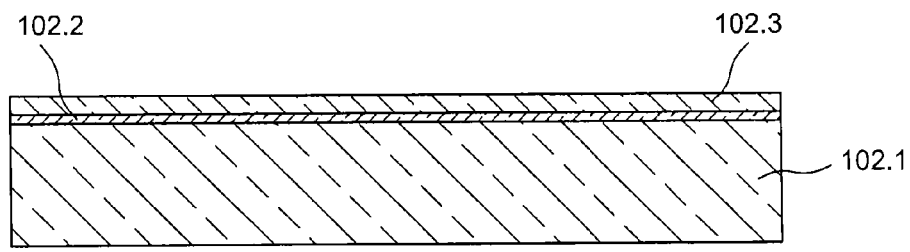
FIGS. 2A to 2E are schematic representations of different steps of embodying another example of the method according to the first embodiment.

The element thereby obtained is represented in FIG. 2A

During step a1), a deposition of a layer of $SiO_2$ 108 is carried out on the layer 102.3 of the substrate 102, for example of around 0.6 μm of thickness.

A step of lithography is then carried out on the layer 108 by deposition of a resin layer, to delimit a first suspended zone 109. For example, it is wished to form a thickness gauge comprised between 0.2 μm and 1 μm and a length comprised between 3 μm and 100 μm.

Then, the layer 108 is etched with stoppage on the silicon of the front face. The front face is then etched over a depth comprised between 0.3 μm and several um, which corresponds to the desired thickness of the first suspended zone plus an over-etching from 100 nm to several μm. Then the layer of SiGe 102.2 is also etched. It involves for example etchings with stoppage over time. The two etchings are successive, for example of RIE type.

In the example represented, two cavities 110 are formed on either side of the first suspended part 109. Thus the etched part is formed of a portion of the layer of Si 102.3 and of a portion 102.2 of SiGe.

Finally, the resin layer is removed.

Figure 2B:
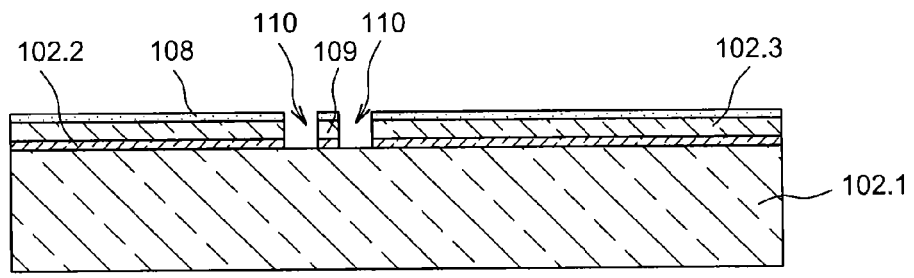

The element thereby obtained is represented in FIG. 2B.

Then, steps similar to those represented in FIGS. 1B and 1C are carried out, they will thus not be described in detail.

During a following step, the first suspended zone 109 is released by isotropic etching of silicon selective with respect to SiGe and to the passivation layer 108.1 which covers the lateral edges of the first suspended zone. It involves an etching with stoppage over time. For example, it involves an RIE based for example on fluorinated gas, or a wet etching.

Figure 2C:
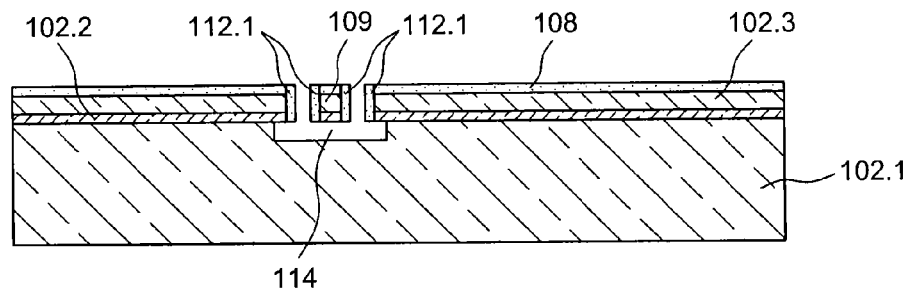

The element thereby obtained is represented in FIG. 2C.

A cavity 114 is then formed under and around the first suspended zone.

The passivation portions 108.1 may be removed, for example by wet etching.

The portion of SiGe situated under the first suspended zone 109 may also be removed, for example by wet etching with respect to the silicon. The removal of the portion of SiGe has the effect of limiting the mechanical strains in the beam 109.

During a following step, a deposition of a stop layer 115 of the etching of the silicon is carried out at least in the bottom of the cavity 114.

Prior to the deposition of the stop layer 115, the passivation portions 112.1 and the oxide layer 8 are preferably removed.

The stop layer 115 is formed in a similar manner to that described in relation with FIG. 1E.

A step of planarisation of the oxide layer 116 may take place.

Figure 2D:
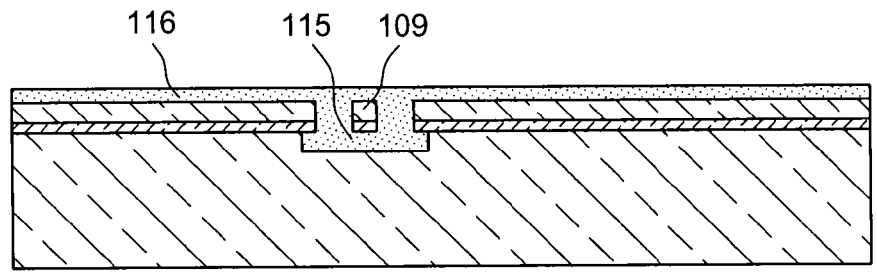

The element thereby obtained is represented in FIG. 2D.

Steps similar to those represented in FIGS. 1F and 1J are then carried out, they will thus not be described in detail. In particular, the first substrate 102 represented in FIG. 2D is bonded with a second substrate 118 on the front face, and contacts 120 are formed on the rear face of the first substrate 102. Thinning of the substrate 102 may be carried out prior to the bonding.

During the following step, a lithography and an etching take place, of the DRIE type (deep reactive-ion etching) of the first substrate 2 so as to release certain zones of the sacrificial layer 116 to form the second suspended zone 119, and to reach the stop layer 115 between the bottom of the cavity 114 and the first suspended zone 109. The thickness of the stop layer 115 is such that it protects the first suspended zone 109 from the deep etching.

Figure 2E:
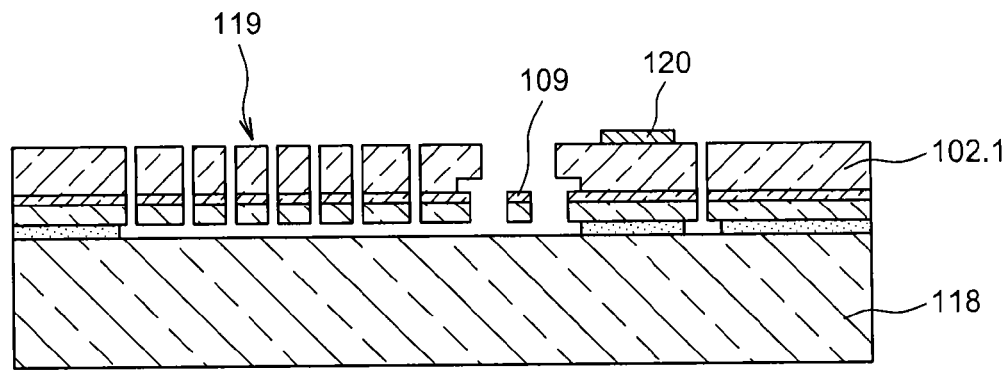

The element thereby obtained is represented in FIG. 2E, the portion of SiGe not having been removed, the first suspended zone 109 then comprises two different semi-conductor layers, and the second suspended zone comprises three layers, two silicon layers separated by a layer of SiGe.

As has already been mentioned, in an advantageous manner, the epitaxied layers of SiGe and silicon at the level of the second suspended zone 119 may be removed, which makes it possible to avoid mechanical strains due to the presence of SiGe in the released zones. Said removal may be obtained by carrying out an etching of said stacking prior to a step of bonding with the second substrate 118 and before the deposition of the sacrificial layer 116.

Moreover, the epitaxied layer of SiGe 102.2 may advantageously be removed above the first suspended zone 109, which makes it possible to avoid mechanical strains due to the presence of SiGe, for example by dry etching of the SiGe, which is selective with respect to the silicon. This step may take place after releasing of the first and second suspended zones.

In FIGS. 3A to 3E may be seen a variant of the method of FIGS. 2A to 2D, wherein the releasing of the first suspended zone is obtained by removal of the layer of SiGe.

During a step prior to step a1), a layer of monocrystalline SiGe 202.2 is formed on a substrate made of monocrystalline silicon 202.1, for example by epitaxial growth, for example of a thickness of 100 nm. Then, a layer of monocrystalline silicon 202.3 is formed on the layer of SiGe 202.2, for example by epitaxial growth, for example of a thickness comprised between 10 nm and several μm, for example 250 nm. The free face of the layer 202.3 forms the front face of the first substrate 102.

During step a1), a deposition of a layer of $SiO_2$ 208 on the layer 202.3 of the substrate 202 is carried out, for example of around 0.6 82 m of thickness.

A step of lithography is then carried out on the layer 208 by deposition of a resin layer, to delimit a first suspended zone, intended for example to form the first suspended zone. For example, it is wished to form a gauge of thickness comprised between 0.2 µm and 1 µm and a length comprised between 3 µm and 100 µm.

Then, the layer 208 is etched with stoppage on the silicon 202.3 of the front face. The front face is then etched with stoppage on the SiGe layer 202.2. It involves for example etchings with stoppage over time.

In the example represented, two cavities 210 are formed delimiting the first suspended zone 209.

Thus, the etched part is formed of a portion of the layer of silicon 102.3 uniquely.

Finally, the resin layer is removed.

Figure 3A:
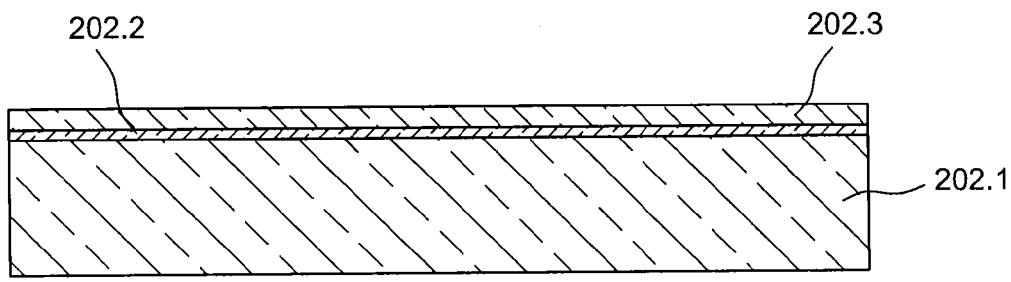
FIGS. 3A to 3E are schematic representations of different steps of embodying a variant of the method of FIGS. 2A to 2E.
Figure 3B:
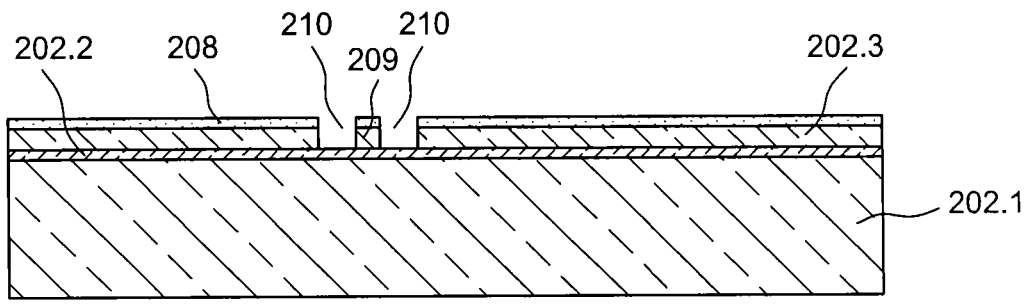

The element thereby obtained is represented in FIG. 3B.

Then, steps similar to those represented in FIGS. 1B and 1C are carried out, they will thus not be described in detail.

During a following step, the first suspended zone 209 is released by isotropic etching of the SiGe selective with respect to the silicon and the passivation layer 208.1 which covers the lateral edges of the first suspended zone. It involves an etching with stoppage over time.

Figure 3C:
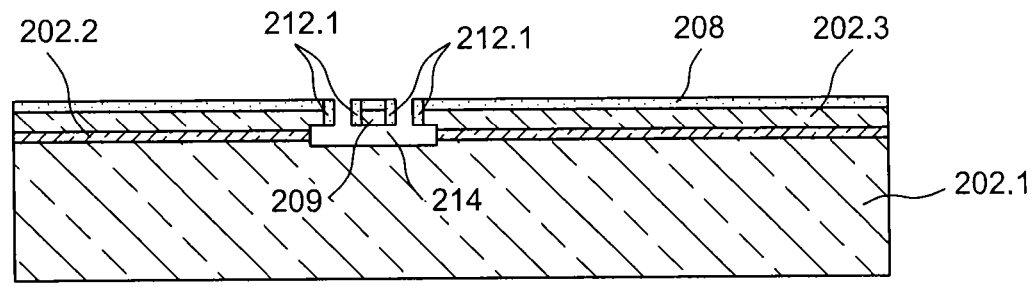

The element thereby obtained is represented in FIG. 3C.

A cavity 214 is then formed under and around the first suspended zone.

During a following step, a deposition of a stop layer 215 of etching of the silicon is carried out at least in the bottom of the cavity 214.

Prior to the deposition of the stop layer 214, the passivation portions 212.1 and the oxide layer 8 are preferably removed.

The stop layer 215 is formed in a manner similar to that described in relation with FIG. 1E.

A step of planarisation of the oxide layer 216 may take place.

Figure 3D:
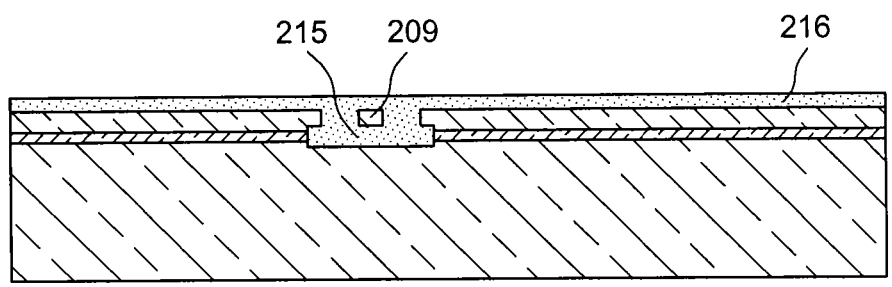

The element thereby obtained is represented in FIG. 3D.

Steps similar to those represented in FIGS. 1F and 1J are then carried out, they will thus not be described in detail. In particular, the first substrate 202 is bonded on a second substrate 218 on the front face, and electrical contacts 220 are formed on the rear face of the first substrate. The substrate 202 may be thinned beforehand.

During the following step, a lithography and an etching take place, of the deep reactive-ion etching or DRIE type for example, of the first substrate 202 so as to release certain zones of the sacrificial layer 216 to form the second suspended zone 219, and to reach the stop layer 215 between the bottom of the cavity 214 and the first suspended zone. The thickness of the stop layer 215 is such that it protects the first suspended zone 209 from the deep etching.

Figure 3E:
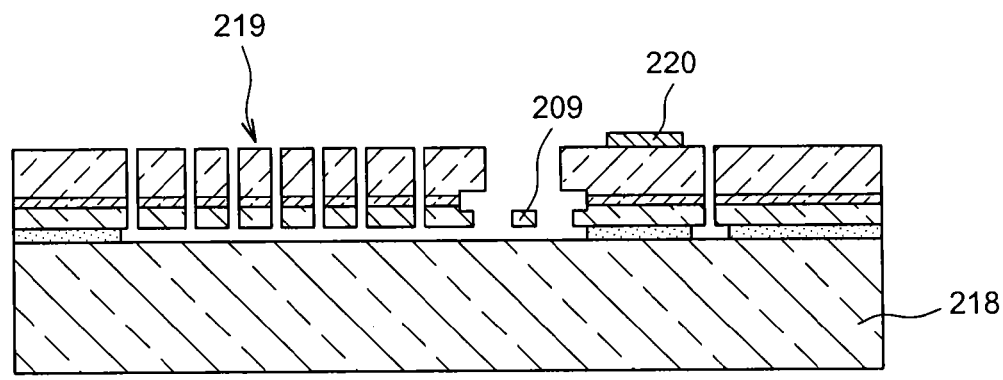

The element thereby obtained is represented in FIG. 3E. The first suspended zone 209 then comprises a single layer of semi-conductor, and the second suspended zone 219 comprises three layers, two made of silicon separated by a layer of SiGe.

In an advantageous manner, the epitaxied layers of SiGe and Si at the level of the second suspended zone 219 may be removed, which makes it possible to avoid mechanical strains in the released zones due to the presence of SiGe. Said removal may be obtained by carrying out an etching of said stacking prior to the step of deposition of the sacrificial layer 216 and the step of bonding with the second substrate.

In FIGS. 4A to 4E may be seen an example of a method according to a second embodiment, which differs from the first embodiment in that the semi-conductor material under the first suspended zone is thermally oxidised and no longer removed by isotropic etching.

The method according to the second embodiment comprises the following main steps from a first bulk type silicon substrate:

a2) machining the front face of the first substrate to define a first suspended zone according to a first thickness;

b2) forming a stop layer of the etching of the first suspended zone between said suspended zone and the rear face obtained by oxidation of the semi-conductor material arranged under the first suspended zone;

c2) depositing a sacrificial layer selective to the etching with respect to the silicon, and more generally with respect to the semi-conductor material of the first substrate;

d2) machining from the rear face of the first substrate up to releasing certain zones of said sacrificial layer to form at least one second suspended zone and/or to make it possible to reach the stop layer of the first suspended zone;

e2) releasing the first and second suspended zones.

In an advantageous manner, between step c2) and step d2), the step c2') of the transfer or the deposition of a support on the front face of the first substrate is provided.

Figure 4A:
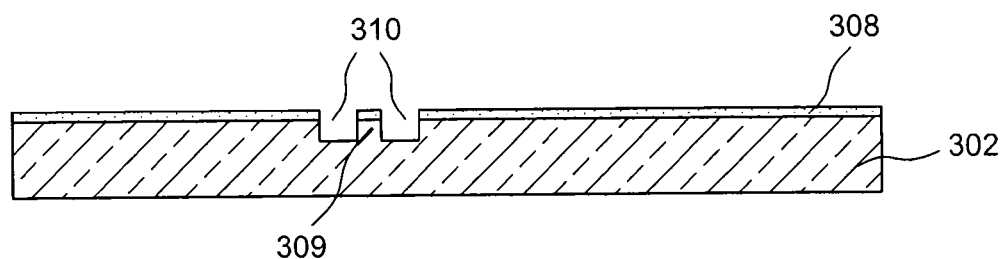
FIGS. 4A to 4E are schematic representations of different steps of embodying an example of the method according to a second embodiment.
Figure 4B:
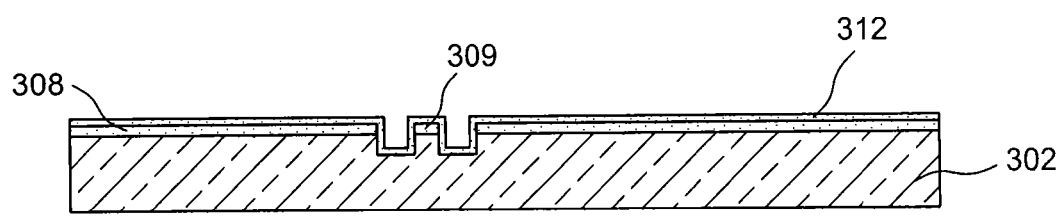
Figure 4C:
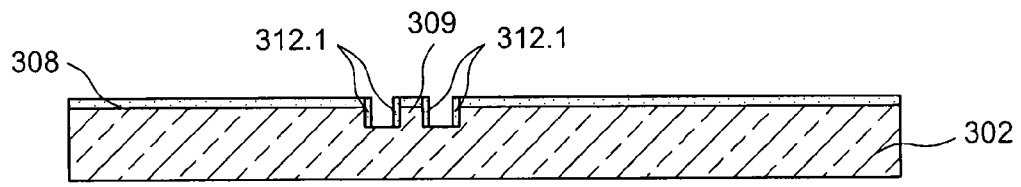

The different sub-steps of step a2) represented in FIGS. 4A to 4C are similar to those represented in FIGS. 1A to 1C of the first embodiment, and will be described successively.

The first substrate 302 covered with an oxide layer 308 is etched so as to delimit two cavities 310 on either side of the first suspended zone 309 (FIG. 4A).

A passivation layer 312 is deposited (FIG. 4B) and etched so as to only leave remaining the passivation portions 312.1 (FIG. 4C).

During a following step b2), a thermal oxidation of the silicon is then carried out up to oxidising completely the portion of silicon situated below the first suspended zone 309. For example, if the width of the zone to be releasd is 0.3 µm, a thermal oxidation greater than 0.15 µm is carried out, the oxidation taking place on either side of the portion to be oxidised. The portion 315 situated under the first suspended zone 309 forms the stop layer of the first embodiment.

Figure 4D:
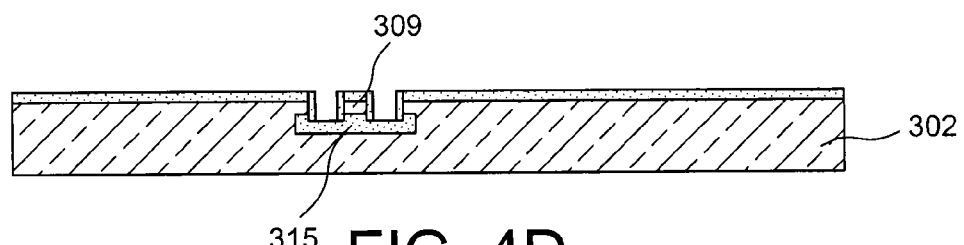

The element thereby obtained is represented in FIG. 4D, the oxidised portion is designated 315. The oxide layer 308 and the passivation portions 312.1 may optionally be removed.

Then, a deposition of $SiO_2$ is carried out in order to fill again at least in part the cavities 310.

Moreover, a sacrificial layer 316 is also formed on the front face of the first substrate 302.

A step of planarisation and/or thinning, for example by chemical mechanical planarisation, of the oxide layer 316 may take place, for example to obtain a layer 316, the thickness of which is comprised between 0.5 µm and 1 µm. This step may be required when the cavities 310 have been entirely filled.

Figure 4E:
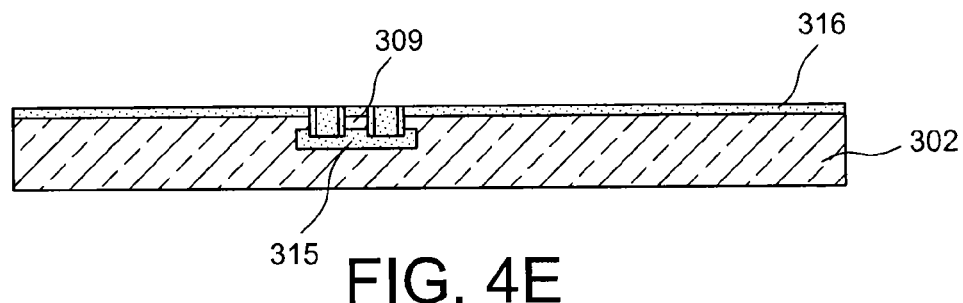

The element thereby obtained is represented in FIG. 4E.

The following steps are similar to the steps represented in FIGS. 1F to 1J.

The first substrate 302 is bonded on a second substrate 318 on the front face. This may have been thinned beforehand.

A lithography and an etching on the rear face of the first substrate take place to define the second suspended zone, the etching takes place with stoppage on the oxide.

Finally, the first and second suspended zones are released, for example with hydrofluoric acid.

Figure 5A:
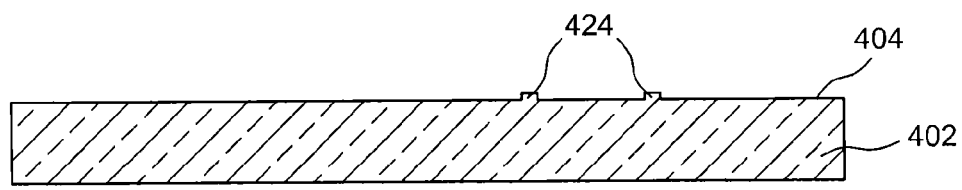
FIGS. 5A to 5C are schematic representations of the first steps of embodying a variant of the method according to the first or the second embodiment, wherein the first substrate is machined beforehand.
Figure 5B:
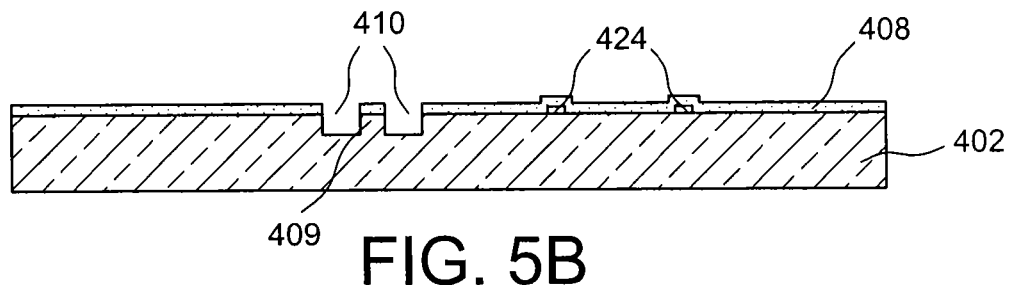
Figure 5C:
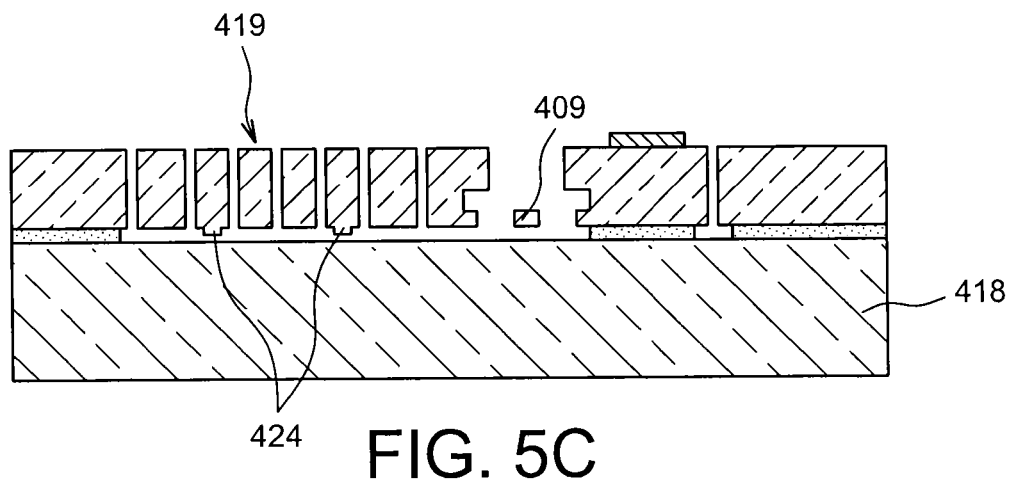

In FIGS. 5A to 5C may be seen a variant of the method according to the first or the second embodiment, wherein the first substrate is machined before its bonding with the second substrate.

In the example that will be described, the machining of the first substrate has the aim of forming mechanical stops. The machined patterns could have another function.

During a step prior to step a), a step of lithography is carried out on the front face 404 of the first substrate 402, to delimit the stops 424.

Then, the front face 404 is etched for example over a depth of 0.3 µm. Finally the resin is removed. The front face comprises two projecting zones 424 forming mechanical stops intended to cooperate with the second substrate.

The element thereby obtained is represented in FIG. 5A.

The following steps are similar to those described previously.

In FIG. 5B may be seen the element after etching of the cavities 410 on either side of the first suspended zone 409.

After deposition of the sacrificial layer, a step of planarisation may take place, in this case it is such that it takes account of the overshoot of the stops of the front face.

In FIG. 5C may be seen the element bonded on the second substrate 418 after releasing of the first 109 and second 419 parts, the stops 424 are facing the front face of the second substrate 418.

Figure 6A:
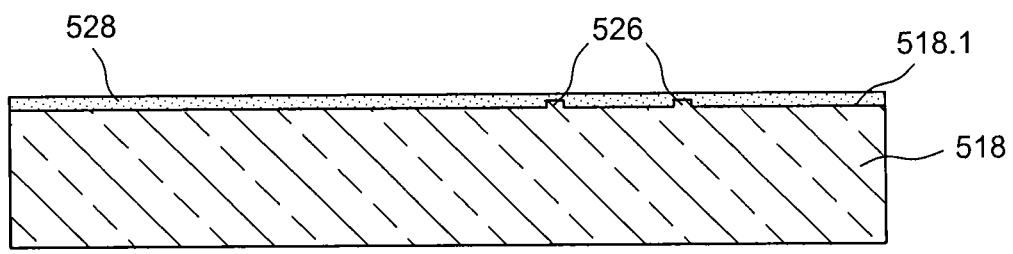
FIGS. 6A and 6B are schematic representations of steps of embodying another variant of the method according to the first or the second embodiment, wherein the second substrate is machined beforehand.
Figure 6B:
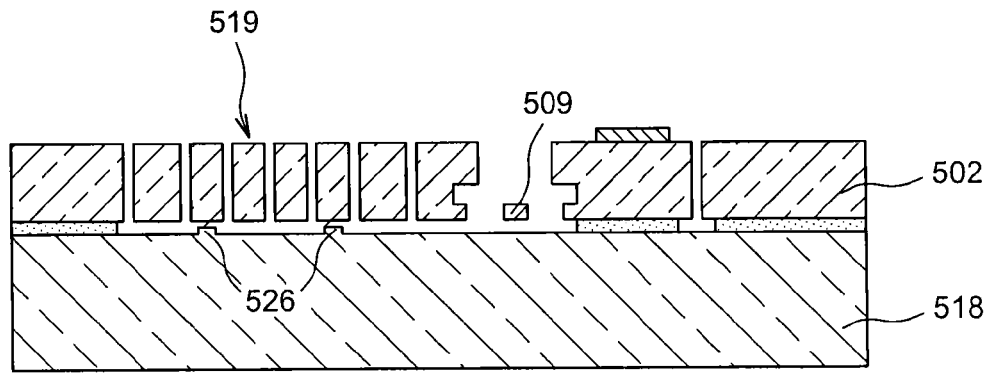

In FIGS. 6A and 6B may be seen a variant of the method according to the first or second embodiment, wherein the second substrate is machined before its bonding on the first substrate.

In the example that will be described, the machining of the second substrate also has the aim of forming mechanical stops. The machined patterns could have another function.

The step of forming the stops 526 is very similar to that of the stops 524 on the first substrate.

During a step prior to the step of bonding to the first substrate 502, a step of lithography is carried out on the front face 518.1 of the second substrate 518, to delimit the stops 526.

Then, the front face 518.1 is etched for example over a depth of 0.5 µm. It involves for example an etching over time.

Then the deposition of a bonding layer 528 is carried out, for example made of $SiO_2$, and a planarisation thereof for example by chemical mechanical polishing (FIG. 6A).

The first substrate may comprise a bonding layer. In a variant, a direct $Si/SiO_2$ bonding or a direct $SiO_2/SiO_2$ bonding may be carried out.

After bonding and etching of the second suspended zone 519, the first 509 and the second 519 suspended zones are released for example using hydrofluoric acid. Said releasing results in the removal of a part of the layer 528 situated at the interface between the two substrates and the uncovering of the stops 526.

Figure 7A:
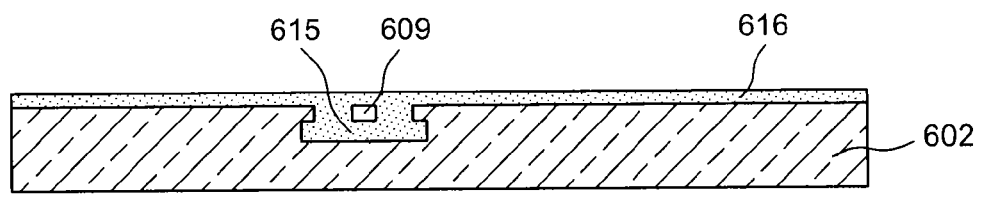
FIGS. 7A to 7E are schematic representations of steps of embodying another variant of the method according to the first or the second embodiment, wherein the sacrificial layer and intermediate layers are structured.
Figure 7B:
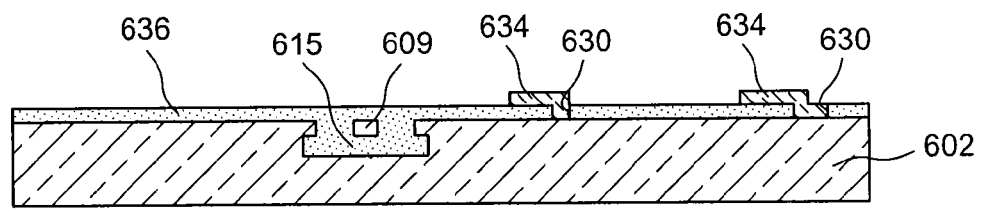
Figure 7C:
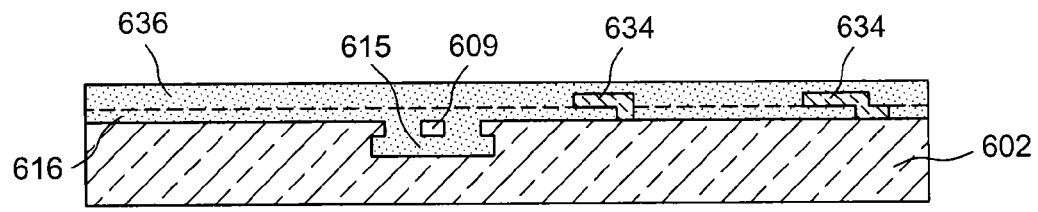

In FIGS. 7A to 7C may be seen another variant of a production method according to the first or second embodiment, wherein the sacrificial layer deposited on the first substrate is structured before bonding and intermediate layers are deposited on the structured sacrificial layer, before bonding, and are also structured. In the example represented, the structuring of the sacrificial layer and intermediate layers has the objective of forming for example stops of the second suspended zone upwards and downwards.

The steps represented in FIGS. 1A to 1E are carried out on a substrate 602. The element of FIG. 7A is obtained, comprising a first surrounded suspended zone 609, the first substrate 602 being covered with a sacrificial layer 616, a stop layer 615 having been formed under the first suspended zone 609.

During a following step, a lithography is carried out on the sacrificial layer 616 to delimit anchoring zones 630 for the stops on the first substrate 602 and an etching of the sacrificial layer 616 in order to open up the anchoring zones 630.

A deposition of a layer of silicon is then carried out to form the stops, for example over a thickness of 0.4 µm.

Then, in order to form the stops, a lithography is carried out on the layer of silicon and an etching thereof. The stops 634 are then formed.

The element thereby obtained is represented in FIG. 7B.

During a following step, a deposition of $SiO_2$ 636 is carried out, on the stops and a planarisation, for example by chemical mechanical polishing, so as to obtain a flat front face intended for the bonding with the second substrate 618.

The element thereby obtained is represented in FIG. 7C.

The element of FIG. 7C then undergoes steps similar to the steps represented in FIGS. 1F to 1I.

Figure 7D:
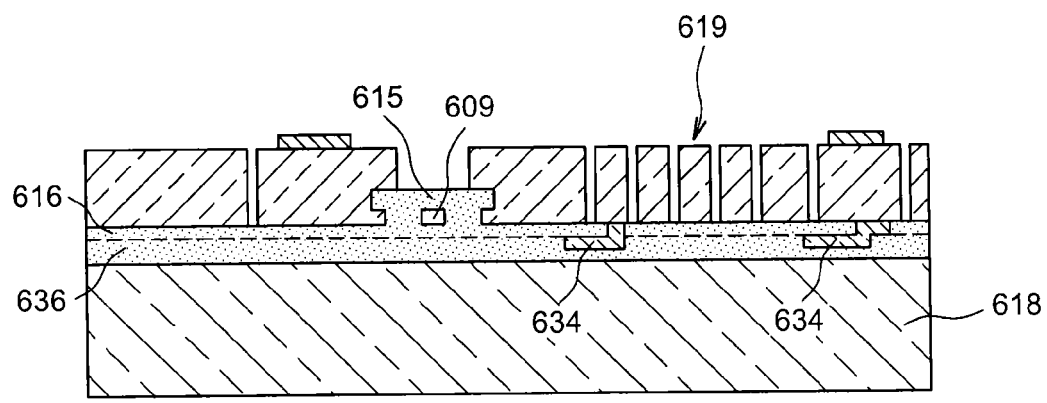

The element obtained comprises the first 602 and the second 618 bonded substrates; the first substrate 602 has been etched by DRIE to define the second suspended zone 619 and reach the sacrificial layer 616, and the stop layer 615. The stops 634 are situated between the first and the second substrate directly in line with the second suspended zone (FIG. 7D).

Figure 7E:
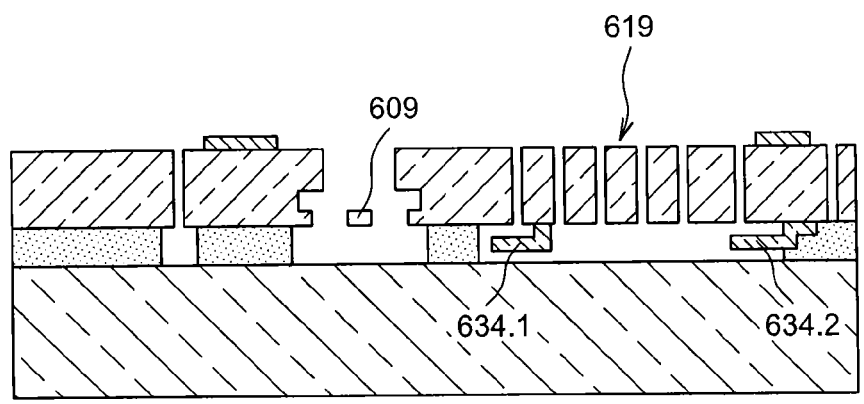

The releasing of the first 609 and second 619 suspended zones is then carried out for example by hydrofluoric acid, which has the effect of uncovering the stops 434 (FIG. 7E).

The step of etching of the second structure is such that one of the stops 634.1 is integral with the moveable second suspended zone and the stop 634.2 is integral with the fixed part of the structure. The stop 634.1 then forms an upwards stop for the second moveable suspended zone and the stop 634.2 forms a downwards stop for the second moveable suspended zone.

Such prior structuring is not limited to forming stops but can also make it possible to manufacture CMOS circuits, to produce a substrate provided with electrodes for example for exciting the active part(s), for detecting, for actuating, to form an electrical routing, to form a ground plane connected to the MEMS layer, to form one or more cavities, to produce anti-bonding stops, etc.

Alternatively, it may be provided either to carry out only a structuring of the sacrificial layer, the intermediate layers not being structured, or to deposit intermediate layers on a non-structured sacrificial layer.

Figure 8A:
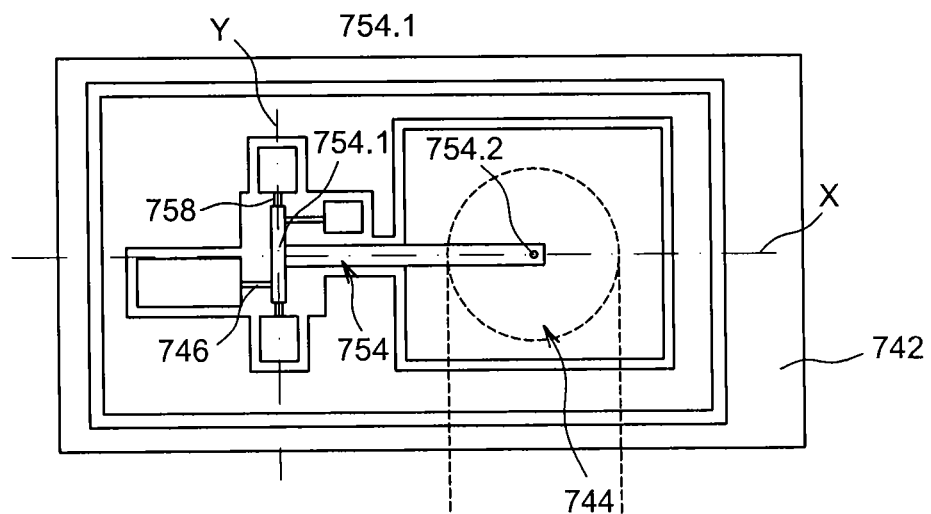
FIGS. 8A and 8B are top and longitudinal sectional views respectively of a pressure sensor which could be produced using the method according to the invention.
Figure 8B:
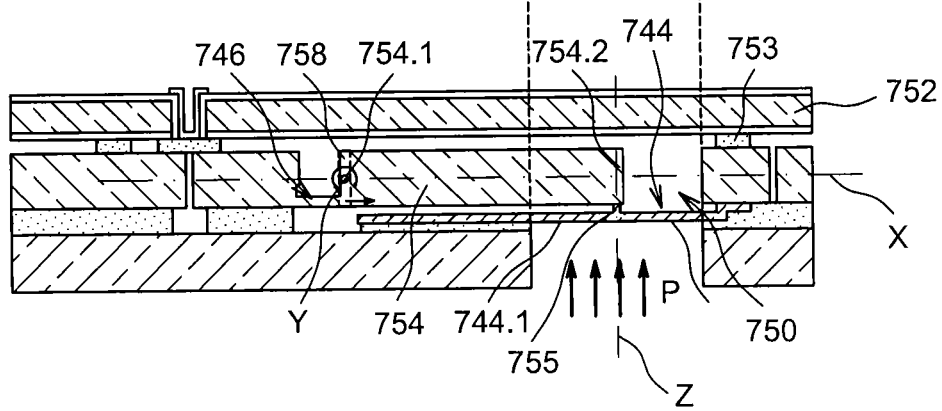

In FIGS. 8A and 8B may be seen top and sectional views, respectively, of an embodiment example of a pressure sensor which may be produced using the method according to the invention with structuring of the sacrificial layer and an intermediate layer made of polycrystalline silicon. In FIG. 8B, the sensor comprises a cover, whereas in FIG. 8A, said cover has been removed.

The sensor comprises a substrate 742, a membrane 744 suspended on the substrate 742, the membrane being such that it deforms under the action of a pressure difference on its two faces, means of detection 746 of the deformation of the membrane 744 situated on the substrate and means able to transmit the deformation of the membrane 744 to the means of detection 746.

The membrane 744 is subjected on one of its faces 744.1 to the pressure P that it is wished to measure, in the representation of FIG. 8B, it is the lower face of the membrane. The other face 744.2 is subjected to a reference pressure which is carried out in a cavity 750 formed between the membrane 744 and a cover 752. In the case of an absolute pressure sensor, a vacuum is produced in the cavity 750. The cover 752 is bonded on the substrate 742 either by means of a bonding bead 753 or by direct bonding, of the type without bead.

In the example represented, the membrane 744 has the shape of a disc (in dotted lines in FIG. 8A) but it could have any other shape, such as a square, hexagonal shape, etc.

The means for transmitting the deformation of the membrane 744 to the means of detection 746 are formed by an arm 754 of longitudinal axis X, mounted moveable in rotation with respect to the substrate at the level of a first longitudinal end 754.1, the axis of rotation Y is substantially parallel to the membrane and to the plane of the substrate. Moreover, the arm 754 is made integral in movement with the membrane at the level of its second longitudinal end 754.2.

This connection may be provided with a flexible articulation 755, of spring type, which makes it possible to transmit entirely the effort along Z induced by the deformation of the membrane, while limiting the parasitic force along X, i.e. along the axis of the arm 754 due to said deformation.

The arm has, in the example represented, the shape of a rigid beam of rectangular section. The beam could in a variant have a trapezoidal shape.

Preferably, the second longitudinal end 754.2 of the arm 754 is integral with the membrane at the level of or close to the zone having the maximum deformation. The movement of the arm around its axis of rotation Y seen by the means of detection is then maximal and the sensitivity of the sensor is then optimised.

The means of detection 746 are arranged on the substrate such that they detect the movement of the first longitudinal end 754.1 of the arm, said movement being proportional to the amplitude of deformation of the membrane 744. The arm 754 forming a lever arm, the strain seen by the means of detection 746 is amplified with respect to the deformation of the membrane. In the case of a measurement by gauge, the lever arm increases the strain exerted on the gauges but reduces the amplitude of deformation compared to the amplitude of deformation of the membrane due to the law of conservation of momentum.

In the example represented in FIG. 8A, the pivot connection of axis Y is formed by a beam 758 of axis Y subjected to torsional stress around the axis Y. The beam is anchored at each of its ends on the substrate. In the remainder of the description, the beam 758 will be designated "axis of torsion". Advantageously, said beam 758 comprises a rigid part in flexion along the X axis to transmit all the strain on which are fixed the gauges, and a part forming axis of torsion at its ends also rigid in flexion along the X axis of the strain.

According to the production method, the membrane 744 and the electrical routing are formed by the intermediate layer of polycrystalline silicon described in relation with FIG. 7B. The strain gauges correspond to the first zones or NEMS parts, and the lever arm corresponds to the second suspended zone or MEMS part.

The possibility of thinning the first substrate after bonding with the second substrate has been described. Alternatively, the first and the second substrate may also be thinned after bonding or uniquely the second substrate.

It may be envisaged to form an active part with more than two different thicknesses, by repeating steps a) and b).

The variants of the method according to the first or second embodiment according to the invention are not mutually exclusive and may be combined.

It is also possible to carry out a CMOS co-integration in three dimensions. In this case, the second substrate is replaced by a CMOS substrate. The recovery of the contacts may take place either through vias or TSV (Through-Silicon Vias), or during bonding, by eutectic bonding in this case, of AlGe type for example, which are techniques well known to those skilled in the art.

The method according to the invention is particularly suited to the production of sensors and microelectromechanical actuators and/or nanoelectromechanical systems.

The invention claimed is:

1. A method for producing a structure comprising an active part comprising at least one first suspended zone and a second suspended zone of different thicknesses from a first substrate, said first substrate comprising a first face made of monocrystalline semi-conductor material, called a front face, and a second face opposite to the first face, called a rear face, said method comprising the following steps:
   a) machining the front face of the first substrate to define the lateral contours of at least one first suspended zone made of monocrystalline semi-conductor material according to a first thickness less than that of the first substrate, and passivating said lateral contours;
   b) forming a stop layer of etching of the first suspended zone between said first suspended zone and the rear face;
   c) forming on the front face of the first substrate a sacrificial layer selective to the etching with respect to the semi-conductor material of the first substrate;
   d) machining from the rear face of the first substrate up to releasing certain zones of said sacrificial layer to form at least one second suspended zone and to make it possible to reach the stop layer of the first suspended zone;
   e) releasing the first and second suspended zones.

2. A method according to claim 1, wherein the passivation of the lateral contours comprises a deposition of a passivation layer on said lateral contours or a thermal oxidation of said contours.

3. A method according to claim 1, wherein, the rear face of the first substrate being monocrystalline semi-conductor material, the second suspended zone is made of monocrystalline semi-conductor material.

4. A method according to claim 1, wherein during step b), the stop layer is formed by thermal oxidation to transform a portion of semi-conductor material situated between the first suspended zone and the rear face, so as to form said stop layer.

5. A method according to claim 1, wherein between step a) and step b), isotropic etching takes place to remove a portion of semi-conductor material situated between the first suspended zone and the rear face, so as to release a cavity intended to receive the stop layer.

6. A method according to claim 1, wherein the stop layer is formed by thermal oxidation, and/or deposition of oxide.

7. A method according to claim 1, wherein the stop layer has a thickness comprised between 0.1 μm and 2 μm.

8. A method according to claim 1, wherein the formation of the sacrificial layer is carried out by deposition of oxide.

9. A method according to claim 8, wherein the stop layer is formed by thermal oxidation, and/or deposition of oxide and wherein step b) and step c) are merged.

10. A method according to claim 1, wherein step d) is carried out by etching, of the deep reactive-ion etching type.

11. A method according to claim 1, wherein the releasing of step e) is carried out with hydrofluoric acid.

12. A method according to claim 1, wherein the first substrate comprises a stacking of a layer of monocrystalline SiGe covered with a layer of monocrystalline silicon, the front face being made of monocrystalline silicon and step a) being such that the first suspended zone comprises a layer of monocrystalline silicon and a layer of monocrystalline SiGe.

13. A method according to claim 12, wherein between step a) and step b), a step of isotropic etching takes place to remove a portion of semi-conductor material situated between the first suspended zone and the rear face, so as to release a cavity intended to receive the stop layer and wherein prior to step b), at least the layer of SiGe of the suspended zone is removed.

14. A method according to claim 1, wherein the method comprises, in between step c) and before step d), a step c') of bonding or depositing a second substrate on the front face of the first substrate.

15. A method according to claim 14, wherein the method comprises, prior to step c'), a step of structuring the second substrate.

16. A method according to claim 15, wherein, during the structuring step, a front face of the second substrate is etched so as to form patterns for the second suspended zone and a deposition is carried out on said structured face of a layer intended to form a bonding layer during the step of bonding of the second substrate.

17. A method according to claim 14, wherein the bonding of the first and second substrates is obtained by direct bonding or eutectic bonding.

18. A method according to claim 1, wherein the method comprises, following step c), structuring the sacrificial layer and/or depositing one or more intermediate layers on said sacrificial layer, said intermediate layers being able to be structured.

19. A method according to claim 18, wherein the method comprises a step of depositing an oxide layer on the structured sacrificial layer and/or the intermediate layers(s) and planarisation of the oxide layer, said oxide layer participating in the bonding.

20. A method according to claim 1, wherein the first substrate is structured before step a).

21. A method according to claim 1, wherein step d) of machining to make it possible to form the second suspended zone and for machining to reach the stop layer is obtained by simultaneous machining or by successive machinings.

22. A method according to claim 1, wherein steps a) to b) are repeated in order to form an active part having more than two layers.

23. A method according to claim 1, wherein the semiconductor material of the front face of the first substrate is monocrystalline silicon.

24. A method, according to claim 1, of microelectromechanical and/or nanoelectromecanical structures for producing sensors and/or actuators.

25. A method according to claim 24, wherein the sensor is a pressure sensor comprising at least one deformable membrane suspended on a substrate, one of the faces of the membrane being intended to be subjected to the pressure to be measured, means of detection of the deformation of the membrane formed by at least one strain gauge, said gauge(s) being formed by the first suspended zone(s), said means of detection being formed from the substrate and means of transmission of the deformation of the membrane, to the means of detection, said means of transmission comprising a longitudinal arm articulated in rotation on the substrate around an axis substantially parallel to the plane of the membrane and being integral, at least partially, with the membrane such that it transmits to the means of detection, in an amplified manner, the deformation or the strain from the deformation of the membrane, said longitudinal arm being formed by the second suspended zone, said means of transmission being formed from the substrate.

* * * * *